US008643156B2

(12) United States Patent  
Qiu et al.

(10) Patent No.: US 8,643,156 B2  
(45) Date of Patent: Feb. 4, 2014

(54) LEAD FRAME FOR ASSEMBLING SEMICONDUCTOR DEVICE

(75) Inventors: Shunan Qiu, Yingtan (CN); Zhigang Bai, Tianjin (CN); Haiyan Liu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 2 days.

(21) Appl. No.: 13/605,990

(22) Filed: Sep. 6, 2012

(65) Prior Publication Data

US 2013/0234306 A1 Sep. 12, 2013

(30) Foreign Application Priority Data

Mar. 6, 2012 (CN) .......................... 2012 1 0057325

(51) Int. Cl.
*H01L 23/495* (2006.01)
*H01L 21/60* (2006.01)

(52) U.S. Cl.
USPC ........... 257/670; 257/666; 257/667; 257/674; 257/676; 257/E23.031; 257/E21.506; 438/111; 438/123

(58) Field of Classification Search
USPC .................. 257/666, 667, 674, 676, E23.031, 257/E21.506; 438/111, 123
See application file for complete search history.

(56) References Cited

U.S. PATENT DOCUMENTS

| 5,270,262 | A | * | 12/1993 | Switky et al. .................... 29/827 |
| 5,285,104 | A | * | 2/1994 | Kondo et al. .................. 257/666 |
| 5,457,341 | A | * | 10/1995 | West .............................. 257/666 |
| 6,225,146 | B1 | * | 5/2001 | Yamaguchi et al. .......... 438/123 |
| 6,967,125 | B2 | | 11/2005 | Fee |
| 7,598,606 | B2 | | 10/2009 | Chow |

* cited by examiner

*Primary Examiner* — Peniel M Gumedzoe
(74) *Attorney, Agent, or Firm* — Charles Bergere

(57) ABSTRACT

A lead frame has a flag, a peripheral frame, and main tie bars coupling the flag to the peripheral frame. At least one cross tie bar extends between two of the main tie bars and an inner row of external connector pads extending from an inner side of the cross tie bar and an outer row of external connector pads extending from an outer side of the cross tie bar. Both an inner non-electrically conductive support bar and an outer non-electrically conductive support bar are attached across the two of the main tie bars. The inner non-electrically conductive support bar is attached to upper surfaces of the two of the main tie bars and to upper surfaces of the inner row of the external connector pads.

18 Claims, 7 Drawing Sheets

LEAD FRAME FOR ASSEMBLING
SEMICONDUCTOR DEVICE

BACKGROUND OF THE INVENTION

The present invention relates to a lead frame for packaging a semiconductor die, and more particularly, to a lead frame and method for assembling a semiconductor device with a high count of external connector pads.

One typical type of semiconductor chip package is a Quad Flat Pack (QFP) that is assembled with a semiconductor die mounted to a lead-frame. The lead-frame is formed from a sheet of metal that has a die attach pad often called a flag and tie bars that attach the flag to an outer frame. External connector pads on the lead frame, sometimes referred to as lead fingers, are wire bonded to pads or electrodes of the die to provide a means of electrically connecting the die to circuit boards and the like. After the electrodes and external connector pads are wire bonded, the semiconductor die and external connector pads are encapsulated in a mold compound such as a plastics material to form a semiconductor chip package generally leaving only the outer frame and the undersides of the external connector pads exposed. The semiconductor chip package is then cut from the outer frame (singulated).

Unfortunately, the inherent structure of lead frames for Flat Pack and QFP packages limits the number of external connector pads that can be used for a specific package size. Such a limitation may be in conflict with the general trend in semiconductor technology of doubling the functional complexity of semiconductor chips around every eighteen months. It would therefore be beneficial if lead frames and semiconductor chip packages could provide for increased external connector pad counts.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
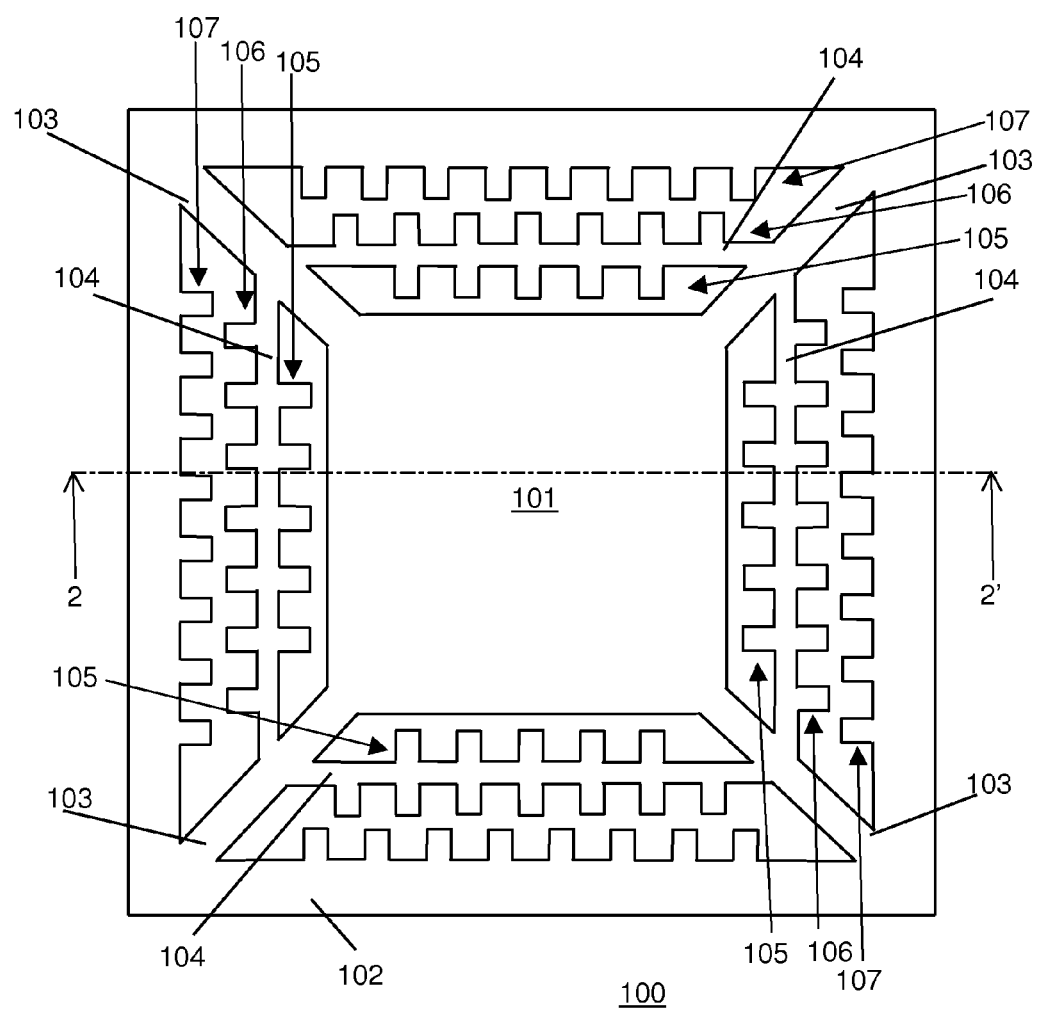
FIG. 1 is a top plan view of a lead frame in accordance with a preferred embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, the terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a method for assembling a semiconductor device comprising providing a lead frame that has a flag, a peripheral frame, main tie bars coupling the flag to the peripheral frame, at least one cross tie bar extending between two of the main tie bars and an inner row of external connector pads extending from an inner side of the cross tie bar and an outer row of external connector pads extending from an outer side of the cross tie bar. The method includes attaching both an inner non-electrically conductive support bar and an outer non-electrically conductive support bar across the two main tie bars. The inner non-electrically conductive support bar is attached to and abuts upper surfaces of the two main tie bars and also is attached to and abuts upper surfaces of the inner row of the external connector pads.

The outer non-electrically conductive support bar is attached to and abuts the upper surfaces of the two main tie bars and also is attached to and abuts upper surfaces of the outer row of external connector pads. The method includes removing the cross tie bar so that the inner row of external connector pads is supported by the inner non-electrically conductive support bar and the outer row of external connector pads is supported by the outer non-electrically conductive support bar. Mounting a semiconductor die to the flag is then performed, after which pads on the semiconductor die are electrically connected to respective pads on the inner row of external connector pads and respective pads on the outer row of external connector pads. The semiconductor die is then encapsulated and the peripheral frame is separated to form the finished package.

In another embodiment, the present invention provides a lead frame having a peripheral frame, a flag, main tie bars coupling the flag to the peripheral frame and an inner non-electrically conductive support bar extending across two of the main tie bars and supporting an inner row of external connector pads. An outer non-electrically conductive support bar extends across the two of the main tie bars and supports an outer row of external connector pads.

In a further embodiment, the present invention provides a semiconductor device having a lead frame with a peripheral frame, a flag, main tie bars coupling the flag to the peripheral frame, an inner non-electrically conductive support bar extending across two of the main tie bars and supporting an inner row of external connector pads. An outer non-electrically conductive support bar extends across the two of the main tie bars and supports an outer row of external connector pads. A semiconductor die is mounted to the flag. The semiconductor die has pads electrically connected to respective pads on the inner and outer rows of external connector pads, and an encapsulant covers the semiconductor die.

Referring now to FIG. 1, a top plan view of a lead frame 100 in accordance with a preferred embodiment of the present invention is illustrated. The lead frame 100 has a flag 101, a peripheral frame 102 and main tie bars 103 coupling the flag 101 to the peripheral frame 102. Cross tie bars 104 extend between respective pairs of the main tie bars 103 and an inner row of external connector pads 105 extends from and inner side of the cross tie bar 105. There is also an outer row of external connector pads 106 that extends from an outer side of the cross tie bar 106. As shown in FIG. 1, pads of each one of the inner rows of external connector pads 105 is aligned with a respective pad of the outer row of external connector pads 106. However, in some embodiments each pad of the inner row of external connector pads 105 is staggered relative to a pad of the outer row of external connector pads 106. The lead frame 100 has a peripheral row of external connector pads 107 extending from the peripheral frame 102 and pads of the peripheral row of external connector pads 107 are staggered relative to pads of the outer row of external connector pads 106.

Figure 2:
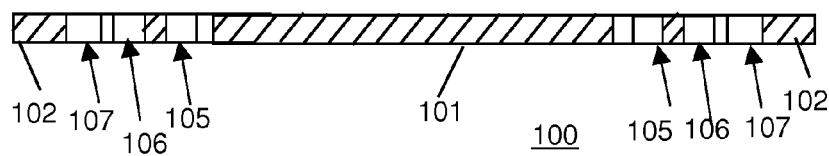
FIG. 2 is a cross sectional view through 2-2' of FIG. 1.
Figure 3:
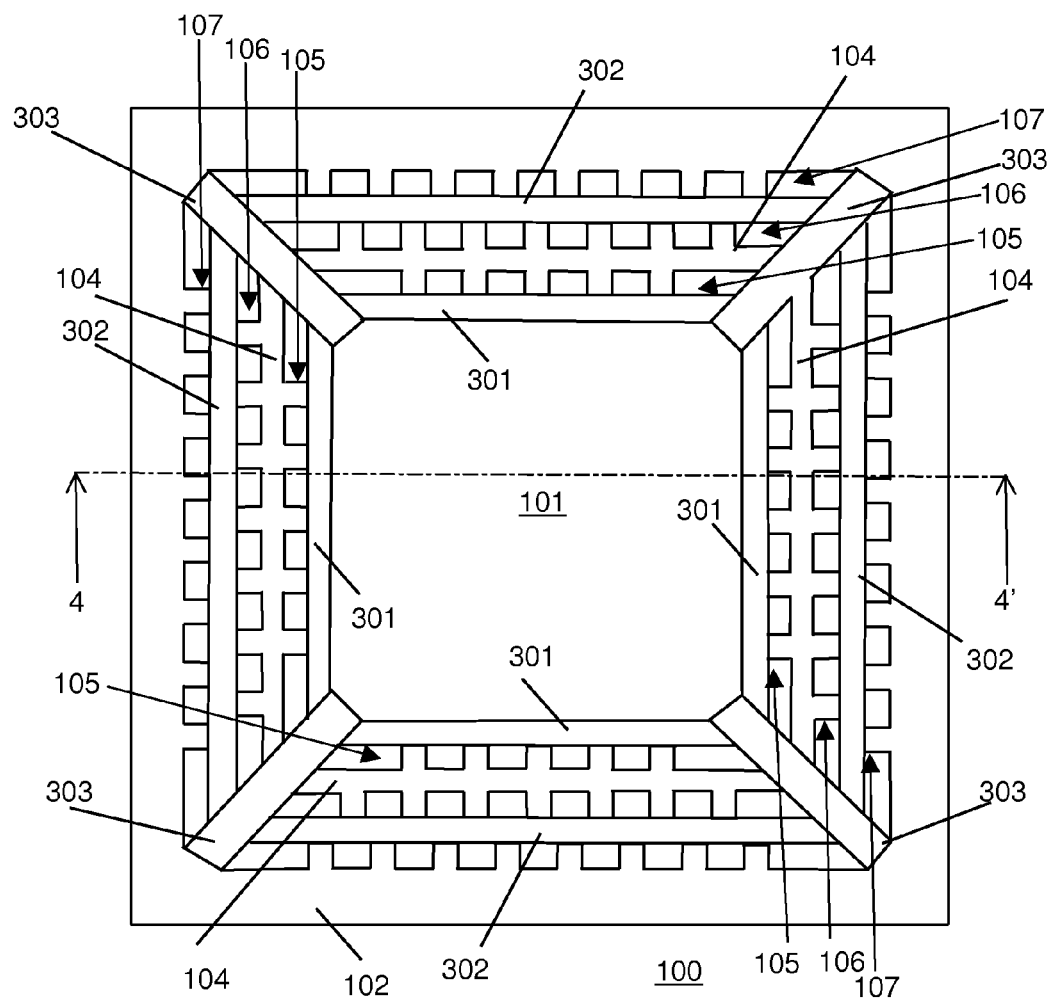
FIG. 3 is a top plan view of the lead frame of FIG. 1 after attaching support bars to the lead frame.

FIG. 2 is provided to illustrate the lead frame 100 from a side cross sectional view. In FIG. 3 there is illustrated a top plan view of the lead frame 100 after there has been performed a process of attaching support bars to the lead frame 100. The process includes attaching both an inner non-electrically conductive support bars 301 and an outer non-electrically conductive support bars 302 across respective pairs of the main tie bars 103. In this regard, the inner non-electrically conductive support bars 301 are attached to upper and abut surfaces of the main tie bars 103 and also they are also attached to and abut upper surfaces of the inner row of external connector pads 105. Furthermore, the outer non-electrically conductive support bar 302 is attached to and abuts upper surfaces of the two of the main tie bars and it also is attached to and abuts upper surfaces of the outer row of external connector pads 106.

Each inner non-electrically conductive support bar 301 and each outer non-electrically conductive support bar 302 provides additional or tertiary support to the lead frame 100 as will be described later. However, in order to provide even further support the process includes attaching a main non-electrically conductive support bar 303 on each of the main tie bars 103. As shown, the non-electrically conductive support bar 303 is higher than the support bar 301, 302 but in other embodiments this need not be the case. It is also possible that the attaching can include attaching each inner non-electrically conductive support bar 301 to an upper surface of the flag 101. This will provide additional support to the lead frame 100 as an underside surface of the inner non-electrically conductive support bar 301 will abut the upper surface of the flag 101. However, this feature is most useful if the surface area of the flag is sufficiently large to accommodate such an attachment. As will be apparent to a person skilled in the art, the attaching can further include attaching each outer non-electrically conductive support bar 302 to an upper surface of the peripheral frame 101 but again this may depend on space availability.

In this embodiment, the process of attaching is typically performed by injection molding of each inner non-electrically conductive support bar 301, each outer non-electrically conductive support bar 302 and each main non-electrically conductive support bar 303.

Figure 4:
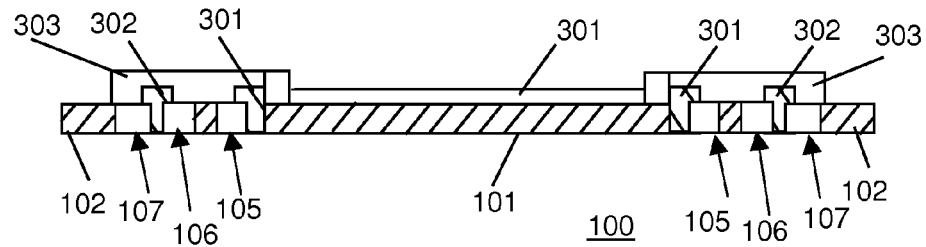
FIG. 4 is a cross sectional view through 4-4' of FIG. 3.
Figure 5:
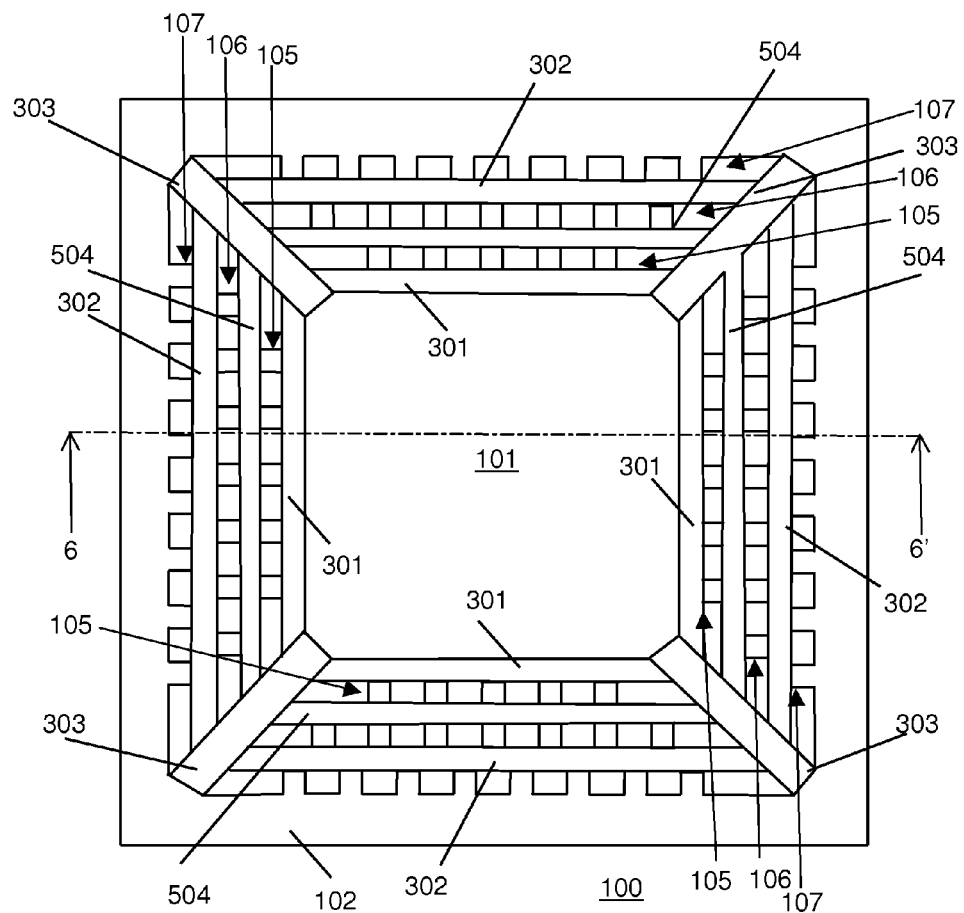
FIG. 5 is a top plan view of the lead frame of FIG. 3 after removing a cross tie bar.

FIG. 4 is provided to illustrate the lead frame 100 from a side cross sectional view after the attaching has been performed. In FIG. 5 there is illustrated a top plan view of the lead frame 100 after removing the cross tie bar 104 of the lead frame 100. The process of removing the cross tie bar 104 is performed typically by cutting or stamping slots 504 and results in each inner row of external connector pads 105 being supported by one of the inner non-electrically conductive support bars 301. Also, the process results in each of the outer row of external connector pads 106 being supported by one of the outer non-electrically conductive support bars 302. In this embodiment, each inner row of external connector pads 105 and each outer row of external connector pads 106 are further supported by two of the main outer non-electrically conductive support bars 303.

Figure 6:
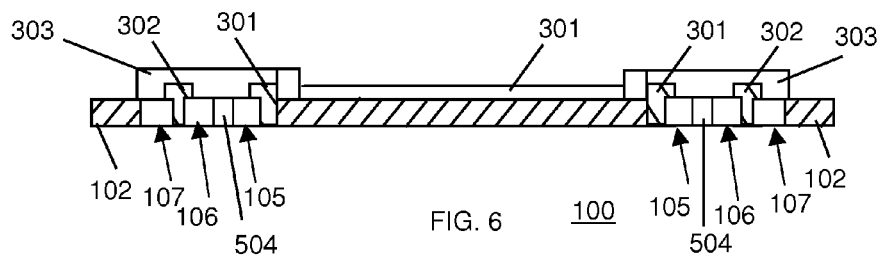
FIG. 6 is a cross sectional view through 6-6' of FIG. 5.
Figure 7:
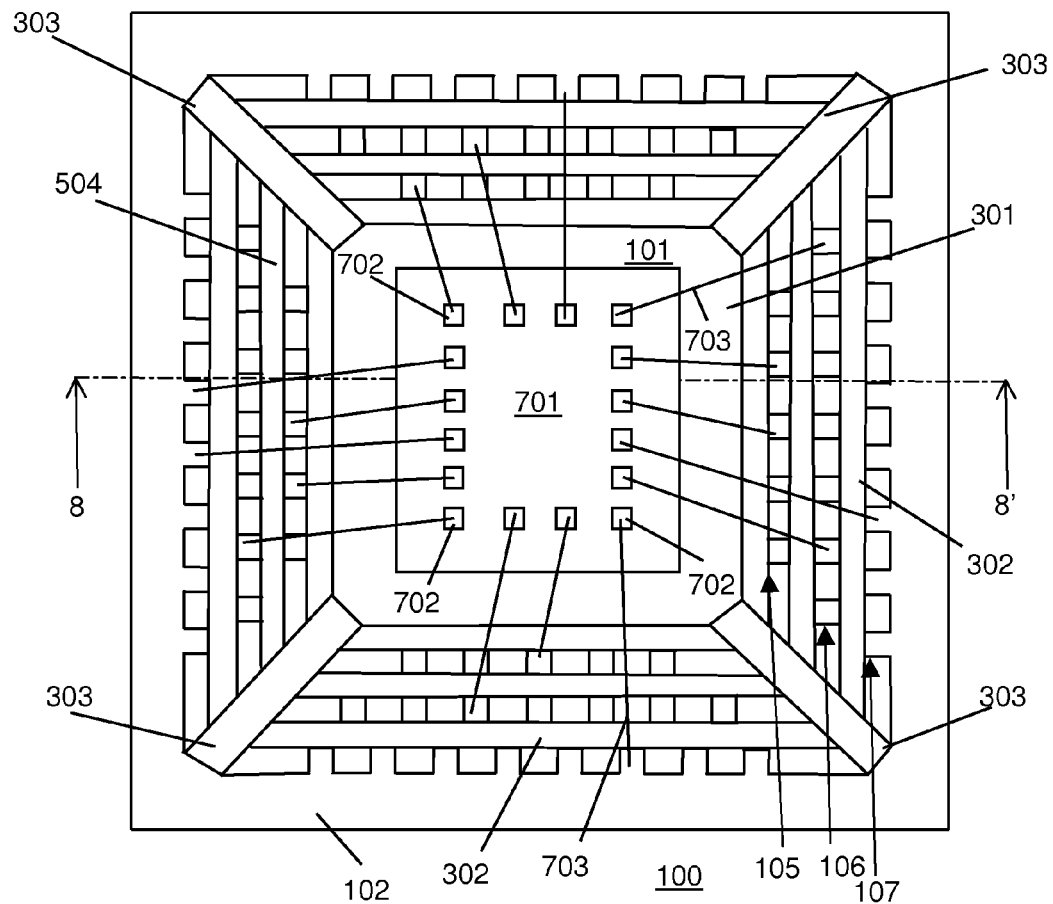
FIG. 7 is a top plan view of the lead frame of FIG. 5 after mounting and electrically connecting a semiconductor die to the lead frame.

FIG. 6 is provided to illustrate the lead frame 100 from a side cross sectional view after process of removing has been performed. In FIG. 7 there is illustrated a top plan view of the lead frame 100 after mounting and electrically connecting a semiconductor die 701 to the lead frame 100. In this process, the semiconductor die 701 is mounted to the flag 101. There is then preformed electrically connecting pads 702 (electrodes) on the semiconductor die 701 to respective pads on the inner row of external connector pads 106 and respective pads on the outer row of external connector pads 105. The electrically connecting is typically performed by a wire bonding process, with bond wires 703, and also includes electrically connecting the pads 701 on the semiconductor die 701 to respective pads of the peripheral row of external connector pads 107.

Figure 8:
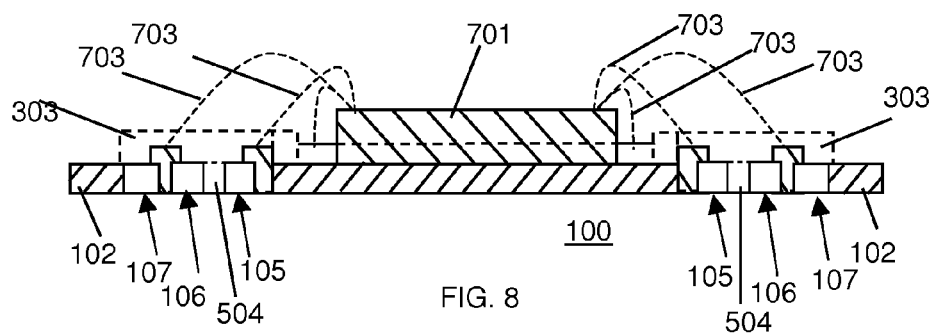
FIG. 8 is a cross sectional view through 8-8' of FIG. 7.
Figure 9:
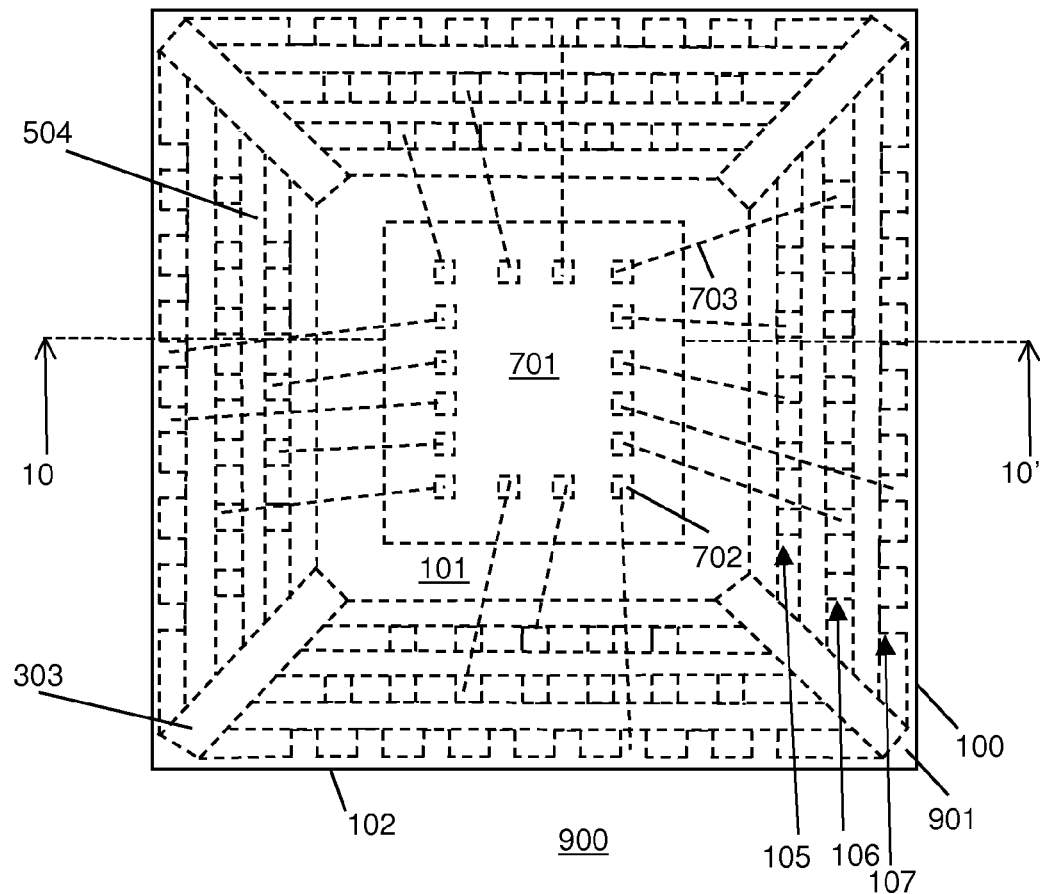
FIG. 9 is a top plan view of the lead frame of FIG. 7 after encapsulating the semiconductor die to form a semiconductor chip package that has been severed from a peripheral frame of the lead frame.
Figure 10:
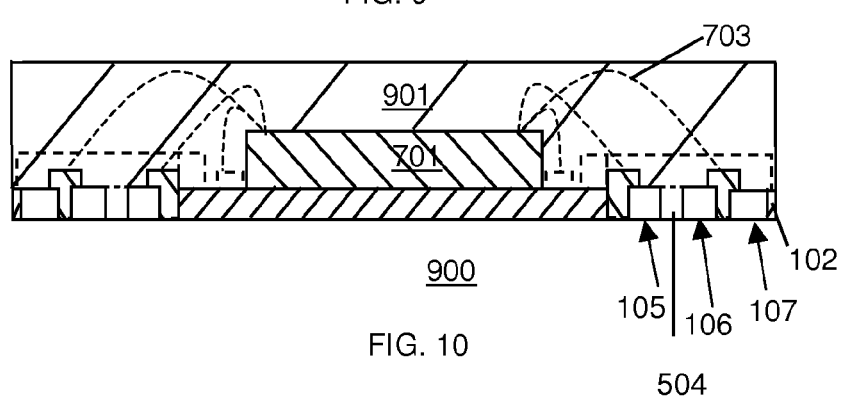
FIG. 10 is a cross sectional view through 10-10' of FIG. 9.

FIG. 8 is provided to illustrate the lead frame 100 from a side cross sectional view after process of mounting and electrically connecting has been performed. In FIG. 9 there is illustrated the lead frame 100 after encapsulating the semiconductor die 701 to provide a semiconductor device 900 that has been separated or severed from the peripheral frame 102. The encapsulating is normally performed by injection molding of a plastics material 901 over the top of the lead frame 100. When viewed from an underside or from a side cross sectional view as shown in FIG. 10, the semiconductor device 900 can be seen to be a QFN package.

Figure 11:
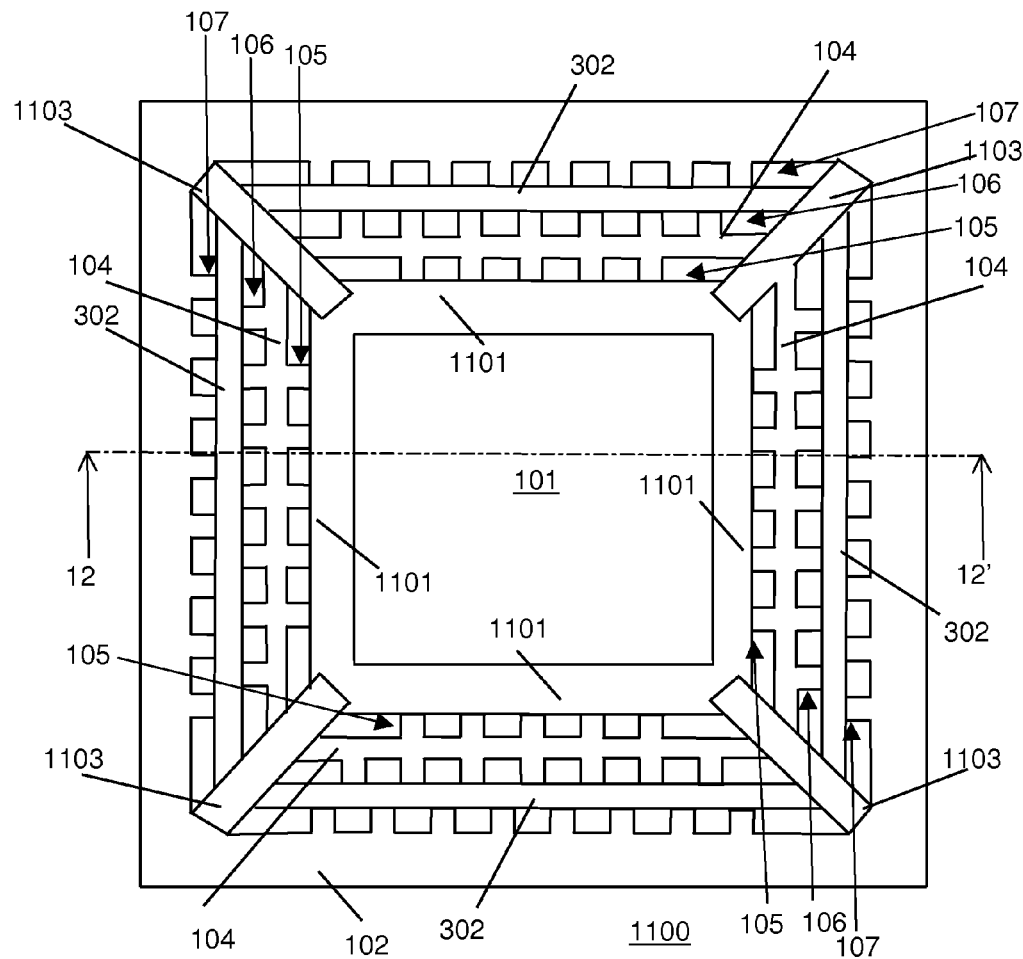
FIG. 11 is a top plan view of the lead frame of FIG. 1 after attaching support bars to the lead frame in accordance with another preferred embodiment of the present invention.

In FIG. 11 there is illustrated a top plan view of a lead frame 100 after attaching support bars to the lead frame 100 in accordance with another preferred embodiment of the present invention. Most of the features of lead frame 100 are identical to the above and therefore to avoid repetition only the differences will be described. In this embodiment, the inner non-electrically conductive support bars 301 are attached across respective pairs of the main tie bars 103 and an underside surface of the inner non-electrically conductive support bars 301 abuts an upper surface of the flag 101. Each main non-electrically conductive support bar 1103 on each of the main tie bars 103 does not extend along a full length of their respective underlying bar 103. As shown the non-electrically conductive support bar 303 is higher than the support bar 301, 302 but in other embodiments this need not be the case.

As in the above embodiments, the process of attaching is typically performed by injection molding of each inner non-electrically conductive support bar 1101, each outer non-electrically conductive support bar 302 and each main non-electrically conductive support bar 1103.

Figure 12:
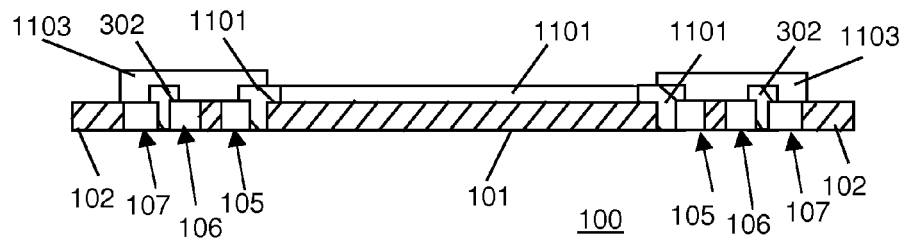
FIG. 12 is a cross sectional view through 12-12' of FIG. 11.

FIG. 12 illustrates the lead frame of FIG. 11 from a side cross-sectional view after the process of attaching has been performed. A semiconductor chip package similar to the semiconductor device 900 will result if the process of attaching each inner non-electrically conductive support bar 1101 and each main non-electrically conductive support bar 1103 is performed on the lead frame 100.

Figure 13:
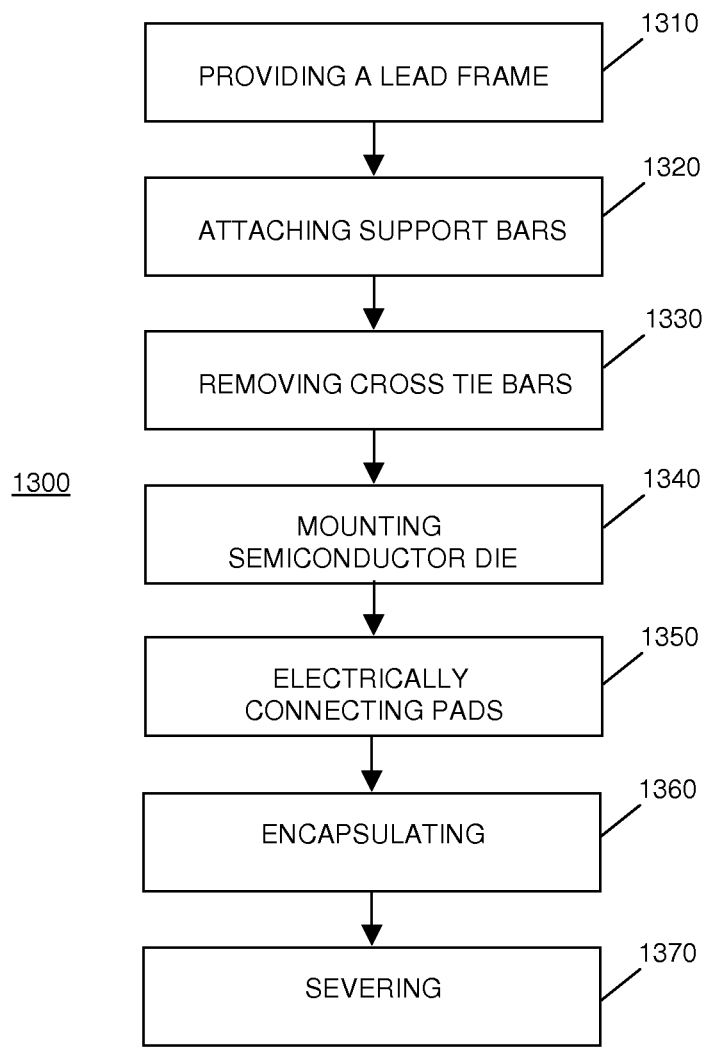
FIG. 13 is a flow chart illustrating a method for assembling the semiconductor chip package of FIG. 9.

An overview of a method 1300 for assembling the semiconductor device 900, or similar package type device, will be described by reference to FIG. 13. At step 1310, the method 1300 provides the lead frame 100 typically to a molding station and at step 1320 there is performed attaching the support bars 301, 302, 303 by injection molding. Once the support bars 301, 302, 303 cool and harden, the lead frame 100 is moved to a punch machine and the cross tie bars 104 are removed by a punching process at step 1330. Once the cross tie bars 104 are removed, the support bars 301, 302, 303 support and maintain the structural integrity of the lead frame 100 and thereby support the connector pads 105, 106 on the lead frame 100. At step 1340, the lead frame 100 is moved to a mounting station and the semiconductor die 701 is mounted or attached to the flag 101 by a conventional process (e.g., with a die attach adhesive). The pads 702 on the semiconductor die 701 are then electrically connected to respective pads 105, 106 and 107 at a wire bonding station at block 1350. The lead frame 100, at a step 1360, is then moved to another molding station and where the method 1300 performs a process of encapsulating the semiconductor die 701 to provide the semiconductor device 900. Since the lead frame 100 is part of a larger sheet of identical frames, at step 1370, the peripheral frame 102 is separated from the device 900 such as with a known singulation process.

Advantageously, the present invention may allow for an economical means of providing increased external connector pad counts especially for Flat Pack and QFN packages. This is because the combination of the connector pads 105, 105 and support bars 301, 302, 303 allows for relatively high pad counts without affecting the structural integrity of the lead frame. Thus, after the semiconductor die 701 is mounted to the flag 101, wire bonding, encapsulating and severing (singulating) is relatively straightforward.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A method of assembling a semiconductor device, comprising:
providing a lead frame that has a flag, a peripheral frame, main tie bars coupling the flag to the peripheral frame, at least one cross tie bar extending between two of the main tie bars and an inner row of external connector pads extending from an inner side of the cross tie bar and an outer row of external connector pads extending from an outer side of the cross tie bar;
attaching both an inner non-electrically conductive support bar and an outer non-electrically conductive support bar across the two of the main tie bars, the inner non-electrically conductive support bar being attached to and abutting upper surfaces of the two of the main tie bars and also attached to and abutting upper surfaces of the inner row of external connector pads, and the outer non-electrically conductive support bar being attached to and abutting the upper surfaces of the two of the main tie bars and also attached to and abutting upper surfaces of the outer row of external connector pads;
removing the cross tie bar so that the inner row of external connector pads are supported by the inner non-electrically conductive support bar and the outer row of external connector pads are supported by the outer non-electrically conductive support bar;
mounting a semiconductor die to the flag;
electrically connecting pads on the semiconductor die to respective pads on the inner row of external connector pads and respective pads on the outer row of external connector pads;
encapsulating the semiconductor die to provide the semiconductor device; and
removing the peripheral frame.

2. The method of claim 1, wherein the attaching is performed by injection molding of the inner non-electrically conductive support bar and outer non-electrically conductive support bar.

3. The method of claim 1, wherein each pad of the inner row of external connector pads is aligned with a respective one of the pads of the outer row of external connector pads.

4. The method of claim 3, wherein pads of the peripheral row of external connector pads are staggered relative to pads of the outer row of external connector pads.

5. The method of claim 1, wherein there is a peripheral row of external connector pads that extends from the peripheral frame and wherein the electrically connecting pads includes electrically connecting pads on the semiconductor die to respective pads of the peripheral row of external connector pads.

6. The method of claim 1, wherein the semiconductor device is a quad flat no-lead (QFN) type semiconductor chip package.

7. The method of claim 1, wherein the attaching includes attaching a main non-electrically conductive support bar on each of the main tie bars.

8. The method of claim 7, wherein the inner non-electrically conductive support bar is attached to and abuts an upper surface of the flag.

9. A lead frame, comprising:
a peripheral frame;
a flag;
a plurality of main tie bars coupling the flag to the peripheral frame;
an inner non-electrically conductive support bar extending across at least two of the main tie bars and supporting an inner row of external connector pads; and
an outer non-electrically conductive support bar extending across the at least two of the main tie bars and supporting an outer row of external connector pads,
wherein the inner row of external connector pads has upper surfaces mounted to the inner non-electrically conductive support bar and the outer row of external connector pads has upper surfaces mounted to the outer non-electricity conductive support bar, and wherein the inner non-electricity conductive support bar is disposed between the flag and inner row of external connector pads, and the inner non-electricity conductive support bar is attached to and abuts an upper surface of the flag.

10. The lead frame of claim 9, wherein the inner non-electrically conductive support bar is disposed between the flag and inner row of external connector pads.

11. The lead frame of claim 9, wherein the outer non-electrically conductive support bar is disposed between the peripheral frame and outer row of external connector pads.

12. The lead frame of claim 9, wherein a peripheral row of external connector pads extends from the peripheral frame.

13. A semiconductor device, comprising:
- a lead frame with a peripheral frame, a flag, main tie bars coupling the flag to the peripheral frame, an inner non-electrically conductive support bar extending across two of the main tie bars and supporting an inner row of external connector pads, and an outer non-electrically conductive support bar extending across the two of the main tie bars and supporting an outer row of external connector pads;
- a semiconductor die mounted to the flag, the semiconductor die having pads electrically connected to respective pads on the inner and outer rows of external connector pads; and
- an encapsulant encapsulating the semiconductor die.

14. The semiconductor device of claim 13, wherein the inner row of external connector pads has upper surfaces mounted to the inner non-electrically conductive support bar and the outer row of external connector pads has upper surfaces mounted to the outer non-electrically conductive support bar.

15. The semiconductor device of claim 13, wherein the inner non-electrically conductive support bar is disposed between the flag and inner row of external connector pads.

16. The semiconductor device of claim 13, wherein the outer non-electrically conductive support bar is disposed between the peripheral frame and outer row of external connector pads.

17. The semiconductor device of claim 13, wherein a peripheral row of external connector pads extends from the peripheral frame.

18. The semiconductor device of claim 13, wherein the semiconductor chip package is a QFN package.

* * * * *

UNITED STATES PATENT AND TRADEMARK OFFICE
CERTIFICATE OF CORRECTION

PATENT NO.          : 8,643,156 B2                                    Page 1 of 1
APPLICATION NO.     : 13/605990
DATED               : February 4, 2014
INVENTOR(S)         : Qiu et al.

It is certified that error appears in the above-identified patent and that said Letters Patent is hereby corrected as shown below:

In the Claims

Column 6, Line 56-57, Claim 9, please change "non-electricity" to be --non-electrically--

Column 6, Line 58, Claim 9, please change "non-electricity" to be --non-electrically--

Column 6, Line 60, Claim 9, please change "non-electricity" to be --non-electrically--

Signed and Sealed this
Sixteenth Day of September, 2014

Michelle K. Lee
*Deputy Director of the United States Patent and Trademark Office*